US009997495B2

(12) United States Patent
Burger et al.

(10) Patent No.: US 9,997,495 B2
(45) Date of Patent: Jun. 12, 2018

(54) NON-CONTACTING INDUCTIVE INTERCONNECTS

(71) Applicant: Elwha LLC, Bellevue, WA (US)

(72) Inventors: Douglas C. Burger, Bellevue, WA (US); William Gates, Medina, WA (US); Andrew F. Glew, Portland, OR (US); Roderick A. Hyde, Redmond, WA (US); Muriel Y. Ishikawa, Livermore, CA (US); Jordin T. Kare, Seattle, WA (US); John L. Manferdelli, San Francisco, CA (US); Thomas M. McWilliams, Oakland, CA (US); Craig J. Mundie, Seattle, WA (US); Nathan P. Myhrvold, Medina, WA (US); Burton J. Smith, Seattle, WA (US); Clarence T. Tegreene, Mercer Island, WA (US); Thomas A. Weaver, San Mateo, CA (US); Richard T. Witek, Redmond, WA (US); Lowell L. Wood, Jr., Bellevue, WA (US); Victoria Y. H. Wood, Livermore, CA (US)

(73) Assignee: Elwha LLC, Bellevue, WA (US)

( * ) Notice: Subject to any disclaimer, the term of this patent is extended or adjusted under 35 U.S.C. 154(b) by 587 days.

(21) Appl. No.: 14/577,735

(22) Filed: Dec. 19, 2014

(65) Prior Publication Data

US 2016/0181227 A1 Jun. 23, 2016

(51) Int. Cl.
*H01L 23/552* (2006.01)
*H01L 25/065* (2006.01)
(Continued)

(52) U.S. Cl.
CPC .......... *H01L 25/0657* (2013.01); *H01L 23/34* (2013.01); *H01L 23/345* (2013.01);
(Continued)

(58) Field of Classification Search
None
See application file for complete search history.

(56) References Cited

U.S. PATENT DOCUMENTS

| 6,114,937 | A  | 9/2000 | Burghartz et al. |
| 7,791,447 | B2 | 9/2010 | Gardner |

(Continued)

OTHER PUBLICATIONS

PCT International Search Report; International App. No. PCT/US2015/065556; dated Mar. 31, 2016; pp. 1-3.
(Continued)

*Primary Examiner* — Ermias Woldegeorgis
(74) *Attorney, Agent, or Firm* — Foley & Lardner LLP

(57) ABSTRACT

A non-contacting inductive interconnect of a three-dimensional integrated circuit includes a first silicon substrate having a first inductive loop. A first layer of high permeability material is deposited on the first silicon substrate that has the first inductive loop forming a first high permeability structure. The circuit further includes a second silicon substrate having a second inductive loop. A magnetic coupling is formed between the first inductive loop and the second inductive loop. The first high permeability structure can enhance the magnetic coupling between the first inductive loop and the second inductive loop. In some embodiments, a second layer of the high permeability material is deposited on the second silicon substrate that has the second inductive loop forming a second high permeability structure. The first high permeability structure and the second high permeability structure can form a magnetic circuit coupling the first inductive loop and the second inductive loop.

31 Claims, 9 Drawing Sheets

(51) Int. Cl.
*H01L 23/34* (2006.01)
*H01L 23/522* (2006.01)
*H01L 23/64* (2006.01)
*H01L 43/02* (2006.01)
*H01L 43/08* (2006.01)
*H01L 23/48* (2006.01)
*H01L 27/22* (2006.01)

(52) U.S. Cl.
CPC .......... *H01L 23/48* (2013.01); *H01L 23/5227* (2013.01); *H01L 23/552* (2013.01); *H01L 23/645* (2013.01); *H01L 27/22* (2013.01); *H01L 43/02* (2013.01); *H01L 43/08* (2013.01); *H01L 2225/06527* (2013.01); *H01L 2225/06537* (2013.01); *H01L 2225/06589* (2013.01); *H01L 2924/0002* (2013.01)

(56) References Cited

U.S. PATENT DOCUMENTS

| | | | |
|---|---|---|---|
| 2003/0100200 A1* | 5/2003 | Franzon | H01L 23/13 439/66 |
| 2010/0264515 A1* | 10/2010 | Nakashiba | H01L 23/48 257/531 |
| 2011/0002582 A1* | 1/2011 | Okamoto | H01L 23/48 385/14 |
| 2011/0049693 A1* | 3/2011 | Nakashiba | H01L 23/48 257/676 |
| 2013/0113478 A1 | 5/2013 | Pant | |
| 2013/0147023 A1 | 6/2013 | Lin et al. | |
| 2013/0168809 A1 | 7/2013 | Yen et al. | |

OTHER PUBLICATIONS

GMR in Isolation, from NVE Corporation(http://www.nve.com/Downloads/db7.pdf),Mar. 2008, 2 pages.

Han et al., "Performance Improvement of Resonant Inductive Coupling for Wireless 3D IC interconnect", 2010 IEEE, 4 pages.

Miura et al., "A 0.14 pJ/b Inductive-Coupling Transceiver With Digitally-Controlled Precise Pulse Shaping", IEEE Journal of Solid-State Circuits, vol. 43 No. 1., Jan. 2008, pp. 285-291.

Qian et al., "Magnetoresistive signal isolators employing linear spin-valve sensing resistors", Journal of Applied Physics, vol. 93, No. 10, May 15, 2003, pp. 6870-6872.

Qun Gu et al., Two 10Gb/s/pin Low-Power Interconnect Methods for 3D ICs, International Solid-State Circuits Conference, Feb. 14, 2007, pp. 448-449.

* cited by examiner

NON-CONTACTING INDUCTIVE INTERCONNECTS

BACKGROUND

A three-dimensional integrated circuit is a multilayer chip formed from semiconductor material in which two or more layers of electronic components are integrated. Such components may be vertically and horizontally integrated into the layers to form a circuit. Typically, the layers of a three-dimensional circuit are interconnected by contacts that create physical circuit connections between the layers.

SUMMARY

One embodiment relates to a system for a non-contacting inductive interconnect of a three-dimensional integrated circuit, including: a first silicon substrate having a first inductive loop deposited thereon, where the first inductive loop provides a first path for current of a circuit of the first silicon substrate; a first layer of high permeability material deposited on the first silicon substrate that has the first inductive loop, forming a first high permeability structure. A second silicon substrate having a second inductive loop deposited thereon, where the second inductive loop provides a second path for current of a circuit of the second silicon substrate. A magnetic coupling is formed between the first inductive loop and the second inductive loop. The first high permeability structure can enhance the magnetic coupling between the first inductive loop and the second inductive loop. In some embodiments, a second layer of the high permeability material deposited on the second silicon substrate that has the second inductive loop, forming a second high permeability structure; and where the first high permeability structure and the second high permeability structure can form a magnetic circuit coupling the first inductive loop and the second inductive loop.

Another embodiment relates to a system for a non-contacting inductive interconnect of a three-dimensional integrated circuit. The three-dimensional integrated circuit includes a first magnetic coupler having a first inductive loop and a first receiving element. The system further includes a second magnetic coupler having a second inductive loop and a second receiving element. A shielding layer is disposed between the first magnetic coupler and the second magnetic coupler that includes high permeability material.

Another embodiment relates to a system for a non-contacting inductive interconnect of a three-dimensional integrated circuit. The system includes a first silicon substrate having a first inductive loop deposited thereon. The first inductive loop provides a first path for current of a circuit of the first silicon substrate. The system further includes a magnetoresistive receiver formed on a second silicon substrate. The magnetoresistive receiver can be configured to sense a magnetic field generated by the first inductive loop and produce an output that is dependent on the magnetic field.

Another embodiment relates to a method of forming a non-contacting inductive interconnect of a three-dimensional integrated circuit. The method includes providing a first silicon substrate having a first inductive loop deposited thereon. The first inductive loop provides a first path for current of a circuit of the first layer of silicon substrate. The method further includes depositing a first layer of high permeability material on the first layer of silicon substrate having the first inductive loop to form a first high permeability structure. A providing a second silicon substrate having a second inductive loop deposited thereon is provided. The second inductive loop provides a second path for current of a circuit of the second layer of silicon substrate. A magnetic coupling between the first inductive loop and the second inductive loop is formed. The first high permeability structure can enhance the magnetic coupling between the first inductive loop and the second inductive loop.

Another embodiment relates to a method of forming a non-contacting inductive interconnect of a three-dimensional integrated circuit. The method includes The method includes providing a first magnetic coupler having a first inductive loop and a first receiving element. A second magnetic coupler having a second inductive loop and a second receiving element is provided. The method further includes forming a shielding layer between the first magnetic coupler and the second magnetic coupler, wherein the shielding layer comprises high permeability material.

Another embodiment relates to a method of forming a non-contacting inductive interconnect of a three-dimensional integrated circuit. The method includes providing a first silicon substrate having a first inductive loop deposited thereon. The first inductive loop provides a first path for current of a circuit of the first silicon substrate. The method further includes depositing alternating layers of a magnetoresistive element on a second silicon substrate. A magnetoresistive receiver is formed on the second silicon substrate. The magnetoresistive receiver can be configured to sense a magnetic field generated by the first inductive loop and produce an output that is dependent on the magnetic field.

Another embodiment relates to a method for maintaining a temperature of a three-dimensional integrated circuit. The method includes sensing a temperature of a section of the three-dimensional integrated circuit containing magnetic material. The sensed temperature of the three-dimensional integrated circuit is compared to a critical temperature of a magnetic material. The critical temperature can be based on a Curie or Neel temperature of the magnetic material within the three-dimensional integrated circuit. A heat source can be controlled to maintain the sensed temperature within a specified range of the critical temperature.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
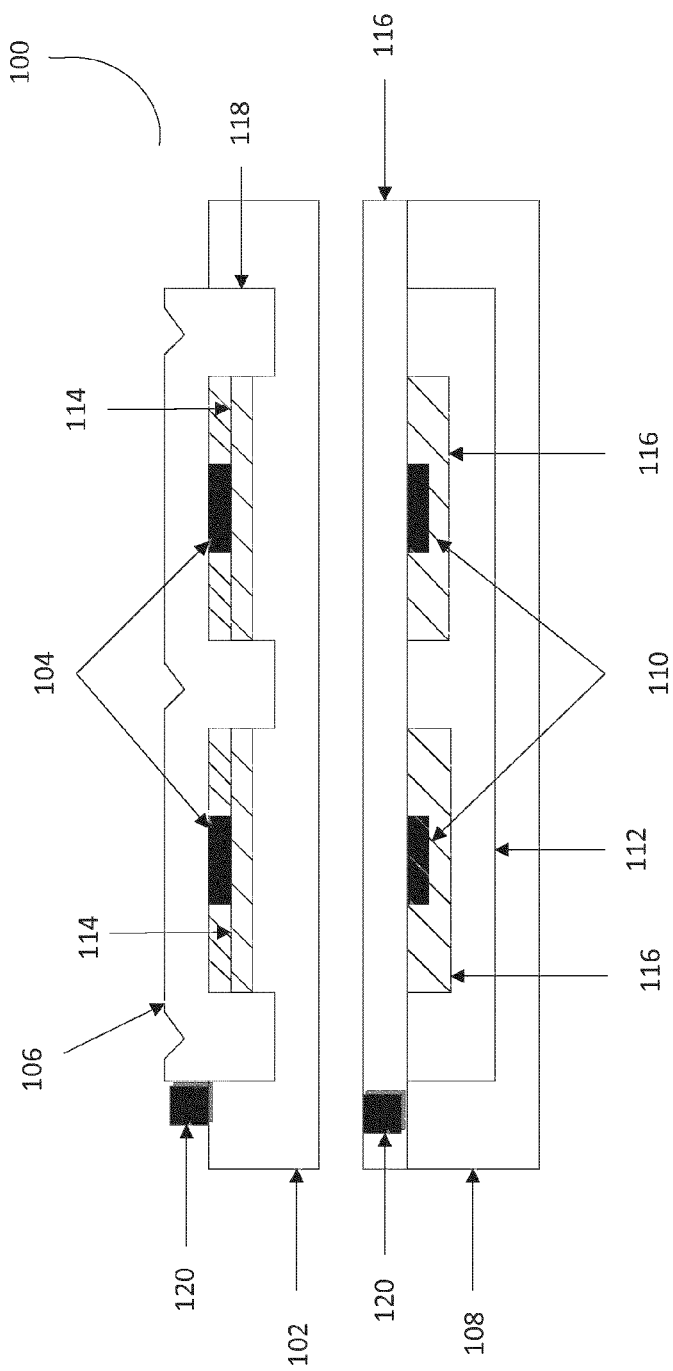
FIG. 1A is a block diagram of a system for non-contacting inductive interconnects in a three-dimensional integrated circuit, according to one embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the scope of the subject matter presented here.

Referring generally to the figures, various embodiments of systems and methods for non-contacting inductive interconnects are shown and described. In general, a three-dimensional (3D) integrated circuit includes two or more layers of semiconductor material (e.g., silicon). The layers of the three-dimensional integrated circuit typically each contain circuitry and various components formed thereon. Each layer may communicate with another layer through the use of interconnects that form connections from one layer to another throughout the three-dimensional integrated circuit. According to the systems and methods disclosed herein, such interconnects may be formed so that a physical connection is not required between electrical contacts of layers. As contrasted to physical interconnects (e.g., solder balls or conducting leads in a package-on-package chip configuration, through-silicon vias which establish an electrical connection between layers of a 3D-chip, etc.), the interconnects disclosed herein are based on inductive connections. In this manner, physical contact between transmitting and receiving elements of the inductive-based connections is not required, as the transmitting and receiving elements generate and receive magnetic fields which magnetically couple the transmitting and receiving sides of the connection. Among other applications, the inductive-based interconnects disclosed herein may be advantageously utilized in high-speed chips (e.g., emitter-coupled logic (ECL) chips, current mode logic (CML) chips, etc.) where voltage swings are desired to be minimized.

Referring to FIG. 1A, a block diagram of a system for non-contacting inductive interconnects in a three-dimensional integrated circuit 100 is shown, according to one embodiment. Three-dimensional integrated circuit 100 includes a plurality of layers of semiconductor material. In one embodiment, circuit 100 includes a first silicon substrate 102 and a second silicon substrate 108. The first silicon substrate 102 may be a first chip in the three-dimensional integrated circuit 100 and the second silicon substrate 108 may be a second chip in the three-dimensional integrated circuit 100. The first and second silicon substrates may be stacked (or otherwise layered) to form a three-dimensional integrated circuit 100 with chip to chip coupling where a layer may be vertically connected to another layer. The first silicon substrate 102 may have an inductive element 104 formed thereon (e.g., a loop, a portion of a loop, a u-shaped path, a spiral coil, first inductive loop, etc.) that creates a path for an electric current. The inductive element 104 can be used to generate and transmit a magnetic field in order to couple with a receiving element (e.g., inductive element 110). The current path may be a wire trace or other path formed from conductive material. In some embodiments, the conductive material is surrounded by a first insulation layer 114 (e.g., oxide or nitride). The first silicon substrate 102 may include a first high permeability material 106. In one embodiment, the high permeability material 106 may be deposited proximate to the inductive element 104 forming a first permeability structure. The second silicon substrate 108 includes a second inductive element 110 (e.g., second inductive loop) deposited thereon. In some embodiments, the conductive material is surrounded by a second insulation layer 116 (e.g., oxide or nitride). The second silicon substrate 108 may include a second high permeability material 112. In one embodiment, the high permeability material 112 may be deposited proximate to the second inductive element 110 forming a second permeability structure. In general, first silicon substrate 102 and second silicon substrate 108 are arranged such that when current flows through inductive element 104 and/or inductive element 110, the inductive elements 104 and 110 magnetically couple (i.e. form an inductive coupler/interconnect) between their respective layers. In an embodiment, the first permeability structure and the second permeability structure form a magnetic circuit coupling the first inductive element 104 and the second inductive element 110 as shown by the magnetic field lines 180 in FIG. 1C.

Figure 1B:
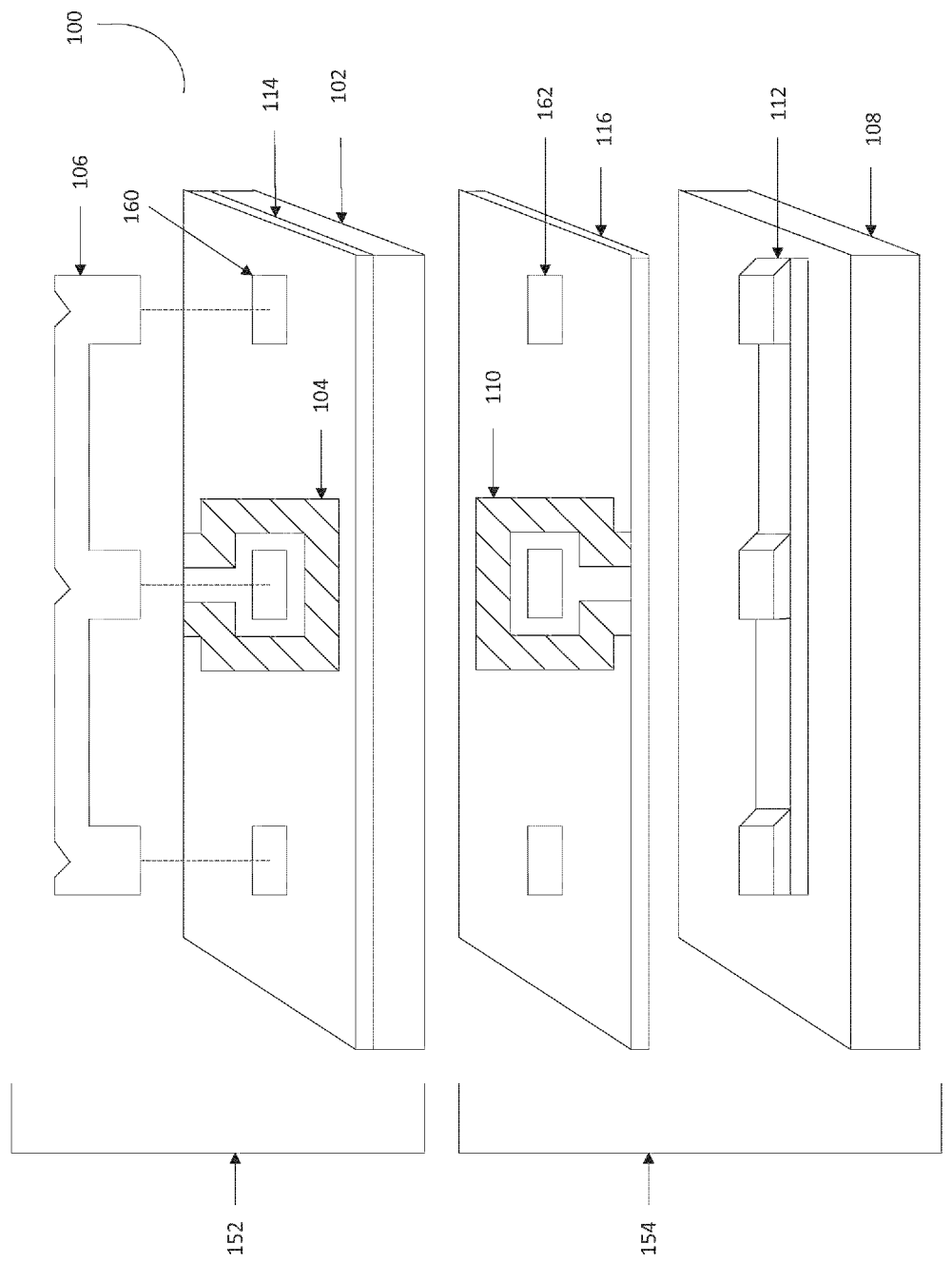
FIG. 1B is a block diagram of an exploded view of a systems for non-contacting inductive interconnects in a three-dimensional integrated circuit, according to one embodiment.
Figure 1C:
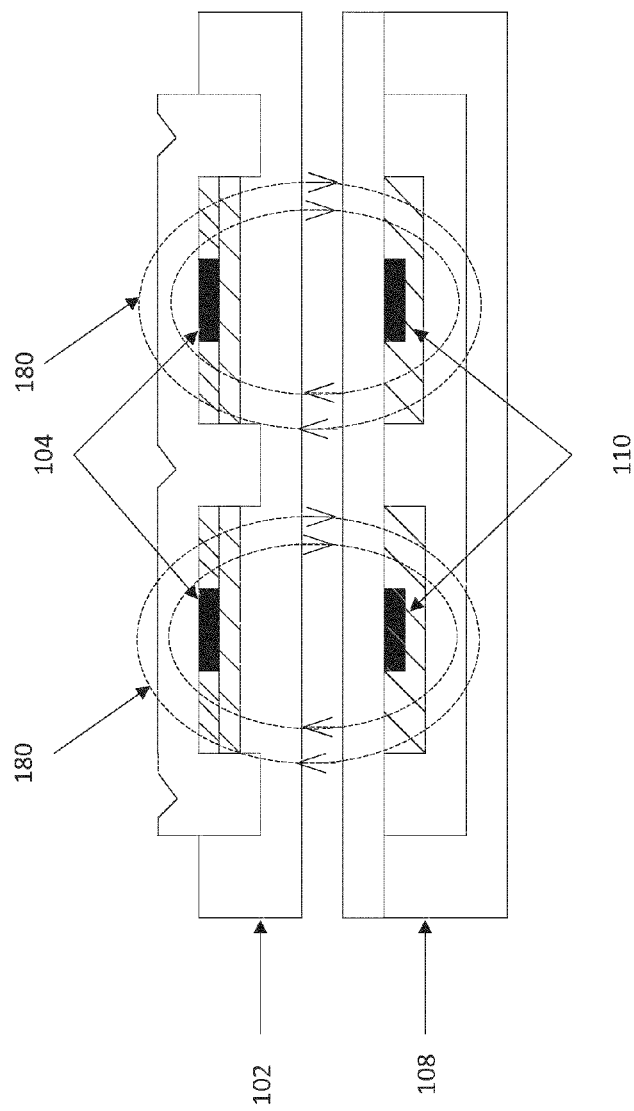
FIG. 1C is a block diagram illustrating inductive coupling in a three-dimensional integrated circuit, according to one embodiment.

In more detail, FIG. 1C illustrates magnetic field lines 180 generated between the first inductive element 104 (e.g., transmitting element) and the second inductive element 110 (e.g., receiving element). In some embodiments, when the first silicon substrate 102 is aligned with the second silicon substrate 108 magnetic fields 180 generated by the transmitting elements 104 may couple with the corresponding receiving elements 110.

Referring back to FIG. 1A, in an embodiment, either of inductive elements 104 and 110 may be a transmitting or receiving element, which may be based on the configuration of three-dimensional integrated circuit 100 and controlled by the current supplied to inductive elements 104 and/or 110. In addition to having the described interconnects, layers of silicon substrate 102 and 108 may each have other active and passive circuitry formed thereon (transistors, diodes, traces, vias, resistors, capacitors, inductors, etc.) that is typical of integrated circuits. In an embodiment, the inductive element 104 may be laid on the first insulation layer 114 to insulate the inductive element 104 from the first silicon substrate 102. Similarly, the second inductive element 110 may be laid on the second insulation layer 116 to insulate the inductive element 110 from the second silicon substrate 108. In some embodiments, the inductive elements 104, 110 are surrounded by insulating material 114, 116.

In an embodiment, the first silicon substrate may include high permeability material 106. The high permeability material 106 may be deposited on or in contact with various surfaces of the inductive element 104 depending on the geometry of the inductive element 104. In an embodiment, the high permeability material 106 is deposited on a top surface of the inductive element 104. In some embodiments, the high permeability material 104 may be deposited such that it is adjacent to or proximate to the inductive element 104. For example, a portion of the high permeability material 104 may be deposited in a trench 118 or via adjacent to the inductive element 104. The first silicon substrate 102 may include a series of trenches 118 formed between portions of the inductive element 104 to form the first chip. At least one surface of the inductive element 104 may be exposed and not in contact with the high permeability material 106

The trenches may be sized to minimize the magnetic gap between the first high permeability structure and the second high permeability structure consistent with the fabrication requirements of the multilayer structure. In one embodiment, the trenches may be formed to space the high permeability structures such that they do not saturate. In some embodiments, the first high permeability structure and the second high permeability structure are in contact with each other. In some embodiments, first high permeability structure (e.g., upper high permeability structure) may be formed subsequent to the formation of the second high permeability structure (e.g., lower high permeability structure) and the upper inductive element, such that the high permeability material forms a continuous magnetic path between the first silicon substrate 102 and the second silicon substrate 108.

In one embodiment, high permeability material 106 is deposited over a portion of the first silicon substrate 102 (e.g., the portion having inductive element 104) or an insulation layer 114. For example, the high permeability material 106 may be formed into an E shape as part of an E-I core and deposited over the first silicon substrate 102 or the insulation layer 114. In another embodiment, high permeability material 106 is deposited of over the entire first silicon substrate 102. In some configurations, high permeability material 106 may also be deposited below inductive element 104.

Similarly, the high permeability material 112 may be deposited on or in contact with various surfaces of the inductive element 110 or surrounding insulation layer 116, depending on the geometry of the inductive element 110. In one embodiment, the high permeability material 112 may be deposited over a portion of the second layer of silicon substrate 108 (e.g., the portion having inductive element 110) or the insulation layer 116. For example, the high permeability material 112 may be formed into an I shape as part of an E-I core and deposited over the first silicon substrate 102 or the insulation layer 116. In other embodiments, the permeability material 112 may be formed into an I shape as part of an E-I core and deposited over the first silicon substrate 102 and under the insulation layer 116. In an embodiment, the high permeability material 112 is deposited on a bottom surface or underneath of the inductive element 110.

In some embodiments, the high permeability material 112 may be deposited such that it is adjacent to or proximate to the inductive element 110. For example, a portion of the high permeability material 112 may be deposited in a trench or via adjacent to the inductive element 110. The first high permeability materials 106 and the second high permeability material 112 may be the same or different types of material. In one embodiment, at least a portion of the high permeability materials 106, 112 includes a ferrite-type material.

The arrangement of first silicon substrate 102 and the second silicon substrate 108 may be such that the first permeability structure and the second permeability structure face each other and form a closed loop (or nearly closed loop) that is penetrated by the inductive elements 104 and 110. In this manner, the high permeability material of the first and second silicon substrates 102, 108 may form a transformer core that is controllable in response to current supplied to either inductive elements 104, 110. By controlling the current supplied to a transmitting side of the core (e.g., to inductive elements 104 and/or 110 based on their configuration) and thereby controlling a generated magnetic flux, a current may be induced in a receiving side of the core in order to interconnect layers of a three dimensional circuit. By controllably inducing the current in the receiving side, data may be transmitted via the inductive coupler across layers of the three dimensional circuit.

In one embodiment, the high permeability material 106, 112 includes a ferromagnetic material. Such a ferromagnetic material can be operated near a Curie temperature of the material in order to increase the material's permeability. The Curie temperature or Curie point is a temperature at which certain magnetic materials undergo a sharp change in their magnetic properties, such as where a material's intrinsic magnetic moments change direction. Magnetic moments are permanent dipole moments within the atom which originate from electrons' angular momentum and spin. Materials have different structures of intrinsic magnetic moments that depend on temperature. At a material's Curie temperature those intrinsic magnetic moments change direction and thus alter their magnetic properties. In some embodiments, the first silicon substrate 102 and the second silicon substrate 108 may each include one or more resistors 120 to keep the respective high permeability structure near the Curie temperature. The resistor 120 may be a heater resistor used to generate heat to maintain or modify a temperature of the tree-dimensional circuit. In another embodiment, the high permeability material 106, 112 includes a material (e.g., an antiferromagnetic material) that may be operated near its Neel temperature in order to increase the material's permeability. The Neel temperature or magnetic ordering temperature, TN, is the temperature above which an antiferromagnetic or ferromagnetic material becomes paramagnetic, for example, the thermal energy becomes large enough to destroy the macroscopic magnetic ordering within the material.

In some embodiments, the three-dimensional circuit 100 includes a temperature sensor. The temperature sensor can detect a current temperature inside or around the three-dimensional circuit 100. In some embodiments, the three-dimensional circuit 100 includes a feed-back mechanism using elements of the three-dimensional circuit 100 to regulate a temperature inside or around the three-dimensional circuit 100. The first inductive element 104, the second inductive element 110, or an additional inductive element may be used to regulate and control the temperature of the three-dimensional integrated circuit 100. For example, a current (e.g., direct current (DC)) of a known or predetermined value may be transmitted to either the first inductive element 104, the second inductive element 110, or an additional inductive element to adjust the temperature (e.g., output more heat) inside the three-dimensional circuit 100. The inductive elements may be used to produce more heat in the three-dimensional circuit 100 to maintain a temperature near the Curie temperature or the Neel temperature. In some embodiments, a neighboring circuitry may be used to regulate and control the temperature of the three-dimensional integrated circuit 100. The three-dimensional circuit 100 may be a component of a device including other circuit elements. The duty cycle or operating point of the neighboring circuitry may be altered such that the neighboring circuitry produces more heat. The extra heat dissipates and increases the temperature of the three-dimensional circuit 100.

In one embodiment, the high permeability material 106, 112 includes a mix of different particles configured to have certain permeability properties. For example, high permeability nanoparticles may be embedded within a liquid, solid, or solid matrix. In one embodiment, the liquid, solid, or solid matrix also has a high permeability. In another embodiment, the liquid, solid, or solid matrix also may not have a high permeability. The components of such a mixture of particles may have various permeability-to-temperature $\mu(T)$ dependencies. In one embodiment, the mixture is configured such that the component particles have opposing permeability-to-temperature dependencies so that a net permeability of the mixture is constant over a certain or pre-defined temperature range. Although discussed as having a first silicon substrate 102 and second silicon substrate 108, three-dimensional integrated circuit 100 may include any number of layers and/or structures, and the scope of the present disclosure is not limited to embodiments having only two substrates.

FIG. 1B depicts an exploded view of the three-dimensional circuit 100 from FIG. 1A. In more detail, FIG. 1B includes a first chip 152 and a second chip 154. The first chip includes a first high permeability material 106, a first inductive coil 104, a first insulation layer 114, and a first silicon substrate 102. In an embodiment, the first inductive element 104 may be laid on the first insulation layer 114, which is formed on a top surface of the first silicon substrate 102. The first high permeability material 106 may be formed into an "E" shape, for example to form an E-I core with a second inductive element formed into an "I" shape. The first insulation layer 114 and the first silicon substrate 102 may include one or more etched pits 160 to receive portions of the first high permeability material 106 (e.g., a trench portion of the high permeability material). For example, in one embodiment, the first insulation layer 114 and the first silicon substrate 102 each include three etched pits 160 to receive portions of the E shaped first high permeability material 106. The etched pits 160 may be of various depths depending on the characteristics of the elements in the three-dimensional circuit 100. In some embodiments, the etched pits 160 are formed into the first insulation layer 114 and the first silicon substrate 102 such that a minimum thickness of non-magnetic material remains in the first silicon substrate 102.

The second chip includes a second inductive element 110, a second insulation layer 116, a second high permeability material 112, and a second silicon substrate 108. In an embodiment, the second inductive element 110 may be laid on the second insulation layer 116. The second high permeability material 112 may be deposited on a top surface of the second silicon substrate 108. The second high permeability material 112 may be formed into an "I" shape, for example to form an E-I core with another inductive element formed into an "E" shape. In some embodiments, the second insulation layer 116 is formed on the second high permeability material 112 and the second silicon substrate 108. The second insulation layer 116 may include one or more etched holes 162 to allow the portions of the second high permeability material 112 to protrude through. In some embodiments, an additional insulation layer (e.g., in addition to the second insulation layer 114) may be formed over the combination of the second inductive element 110, the second insulation layer 114, the second high permeability material 112. In some embodiments, a gap may be formed between the first chip 152 and the second chip 154. The gap may be formed using an adhesive or an insulation layer 116 or both. In other embodiments, the first chip 152 may be in contact with the second chip 154.

Figure 2A:
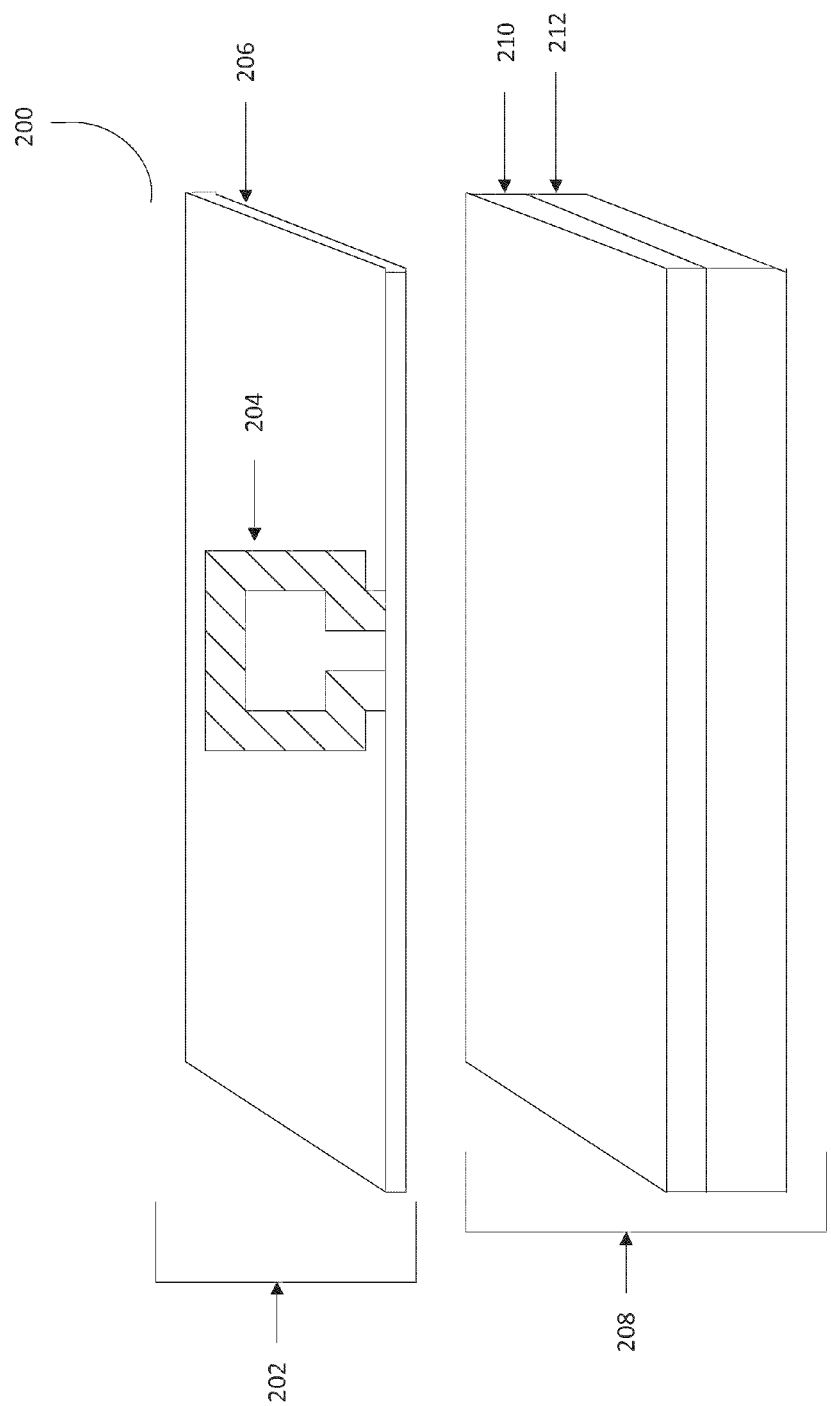
FIG. 2A is a block diagram of a three-dimensional integrated circuit with a magnetoresistive receiver, according to one embodiment.

Referring to FIG. 2A, a block diagram a three-dimensional integrated circuit 200 is shown, according to one embodiment. The three-dimensional circuit 200 includes an inductive loop transmitter 202 and a magnetoresistive receiver 208. In some embodiments, the inductive loop transmitter 202 includes an inductive element 204 formed on an insulation layer 206. The magnetoresistive receiver 208 can be a multi-layered structure of thin-film materials made up of a magnetoresistive element 210 formed on a silicon substrate 212. The inductive element 204 can be used to generate and transmit a magnetic field in order to couple with a receiving element such as the magnetoresistive receiver 208. The insulation layer 206 can be disposed such that it is positioned between the inductive element 204 and the magnetoresistive receiver 208. In some embodiments, the magnetoresistive receiver 208 is configured to sense a magnetic field generated by the inductive loop transmitter 202. In response, the magnetoresistive receiver 208 produces an output based on or proportional to the sensed magnetic field. In one embodiment, the output can be a voltage output that is dependent on the sensed magnetic field. In general, magnetoresistive structures are highly sensitive to magnetic fields. The magnetoresistive receiver 208 can measure or sense magnetic field strength over a wide range of fields. In one embodiment, the magnetoresistive receiver 208 can directly detect magnetic field rather than the rate of change in a magnetic field, and therefore can be used as DC field sensors.

In some embodiments, the magnetoresistive receiver 208 may be physically isolated from the inductive loop transmitter 202. For example, the magnetoresistive receiver 208 may be physically isolated by forming an isolation barrier or layer between the magnetoresistive receiver 208 and the inductive loop transmitter 202. Magnetoresistive receiver 208 may be a device that is configured to utilize various magnetoresistance effects. In one embodiment, magnetoresistive receiver 208 uses giant magnetoresistance (GMR). In another embodiment, magnetoresistive receiver 208 uses tunnel magnetoresistance (TMR). In another embodiment, magnetoresistive receiver 208 uses colossal magnetoresistance (CMR). In yet another embodiment, magnetoresistive receiver 208 may be based on other spin-coupled effects, and the scope of the present disclosure is not limited to using a certain type of magnetoresistance.

Figure 2B:
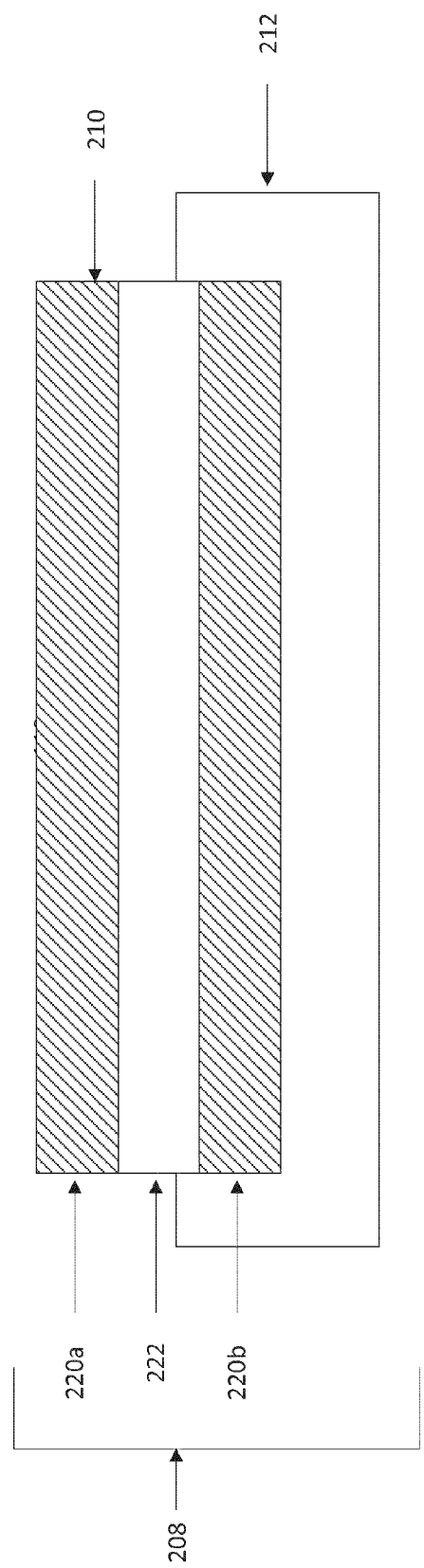
FIG. 2B is a block diagram of a magnetoresistive element, according to one embodiment.

Now referring to FIG. 2B, a detailed view of the magnetoresistive receiver is shown. The magnetoresistive receiver 208 can be a multi-layered structure of thin-film materials made up of a magnetoresistive element 210 formed on a silicon substrate 212. For example, in an embodiment, the magnetoresistive element 210 includes alternating ferromagnetic layers 220a, 220b and non-magnetic layers 222 formed on the silicon substrate 212. The ferromagnetic layers 220a, 220b may be magnetic elements a few nanometers thick separated by equally thin non-magnetic elements 222. For example, and as illustrated in FIG. 2B, the non-magnetic layer 222 can be positioned between (e.g., sandwiched) by the two magnetic layers 220a, 220b. In some embodiments, the magnetoresistive element 210 may be formed in or on the silicon substrate 212. To form the, magnetoresistive element 210 a location for placement of the magnetoresistive element 210 may be etched into a surface of the silicon substrate 212. Next, alternating layers of the magnetoresistive element 210 may be deposited onto the etched surface of the silicon substrate 212. For example, alternating layers of the magnetic 220a, 220b and non-magnetic materials 222 may be deposited onto the silicon substrate 212.

In one embodiment, the magnetic layers 220*a*, 220*b* are designed to have anti-ferromagnetic coupling. This means that the magnetization of these layers is opposite to each other when there is no external magnetic field applied to the material. Antiferromagnetic coupling can be visualized by imagining two bar magnets on either side of a thin sheet of plastic. The magnets couple head to tail (north pole to south pole) across the boundary formed by the plastic. In a similar fashion, the magnetization direction of the magnetic layers in the magnetoresistive element 210 film couple head to tail across the non-magnetic interlayer of the film. The conduction electrons in magnetic materials have a spin characteristic. The electrons are normally referred to as spin up electrons when the material is magnetized in one direction, and spin down electrons when the material is magnetized in the opposite direction. If an external magnetic field of sufficient magnitude is applied to the magnetoresistive element 210, it will overcome the antiferromagnet coupling of the magnetizations between the two magnetic layers. At this point all the electrons in both films will have the same spin. It will then become easier for the electrons two move between the layers. In one embodiment, the magnetoresistive element 210 can be a large change in electrical resistance observed in the artificial thin-film materials as a function of applied magnetic field.

As stated above, the magnetoresistive element 210 can be made up of very thin layers of alternating magnetic 220*a*, 220*b* and non-magnetic materials 222 to allow magnetic modulation of the electron spin in the materials. The spin dependence of conduction electrons in magnetic materials 220*a*, 220*b*, along with the increasing resistivity at very small material thicknesses, combine to make the magnetoresistive receiver effect possible.

Thus, by using the magnetoresistive element 210, a gain may be realized in detecting the magnetic field generated by the inductive loop transmitter 202. In some embodiments, the magnetoresistive element 210 may be directly coupled (DC) to an additional device (e.g., a voltage mode amplifier) without the need of a current mode amplifier, which may otherwise be required if a current pickup based device is used instead of the magnetoresistive element 210.

Figure 3:
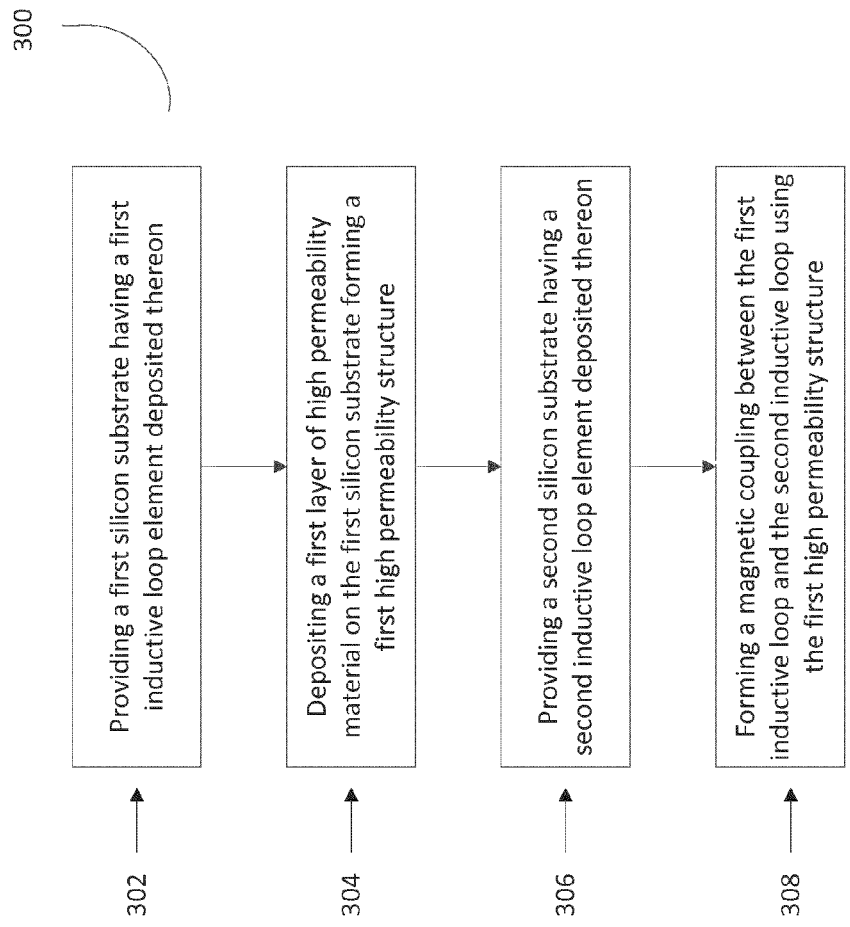
FIG. 3 is a flow diagram of a process of forming a non-contacting inductive interconnect for a three-dimensional integrated circuit, according to one embodiment.

Referring to FIG. 3, a flow diagram of a process 300 for forming a non-contacting inductive interconnect for a three-dimensional integrated circuit is shown, according to one embodiment. In alternative embodiments, fewer, additional, and/or different actions may be performed. Also, the use of a flow diagram is not meant to be limiting with respect to the order of actions performed. In brief overview, a first silicon substrate having a first inductive loop element deposited thereon is provided (302). A first layer of high permeability material is deposited on the first silicon substrate that has the first inductive loop forming a first high permeability structure (304). A second silicon substrate having a second inductive loop element deposited thereon is provided (306). A magnetic coupling between the first inductive loop and the second inductive loop is formed (308). The first high permeability structure enhances the magnetic coupling between the first inductive loop and the second inductive loop.

In some embodiments, a second layer of high permeability material is deposited on the second silicon substrate that has the second inductive loop forming a second high permeability structure. The first high permeability structure and the second high permeability structure can form a magnetic circuit coupling the first inductive loop and the second inductive loop. In an embodiment, a three-dimensional integrated circuit includes a stack of chips including a first silicon substrate (e.g., first chip). In some embodiments, the three-dimensional integrated circuit includes a stack of chips including the first silicon substrate and a second silicon substrate (e.g., second chip). The three-dimensional integrated circuit may include multiple stacks or an array of chips.

The first silicon substrate having a first inductive loop element deposited thereon is provided (302). The three-dimensional integrated circuit may include a stack made up of the first silicon substrate (e.g., first chip) and/or a second silicon substrate (e.g., second chip). Such components may be vertically and horizontally integrated into the layers to form a circuit. In some embodiments, the three-dimensional integrated circuit may include multiple stacks or layers.

In an embodiment, a first high permeability material is deposited on the first silicon substrate that has the first inductive loop forming a first high permeability structure (304). The high permeability material may be in a liquid or solid form. In some embodiments, high permeability nanoparticles are embedded into a liquid or solid to form the high permeability material. The high permeability material may be deposited proximate to or on any surface or portion of the first inductive element. In one embodiment, the first high permeability material is deposited proximate to a top surface of the first inductive element. The high permeability material may form a barrier to direct magnetic fields generated by the inductive element. In some embodiments, the high permeability material may be used as a shield to block magnetic fields generated by neighboring stacks or other components in the three-dimensional integrated circuit.

A second silicon substrate having a second inductive loop element deposited thereon is provided (306). The second silicon substrate may be deposited opposite the first silicon substrate to form a stack in the three-dimensional integrated circuit. The different silicon substrates may be positioned such that their respective inductive elements are aligned or directly opposite each other.

In some embodiments, a second high permeability material is deposited on the second silicon substrate that has the second inductive loop forming a second high permeability structure. The high permeability material may be deposited proximate to or on any surface or portion of the second inductive element. In one embodiment, the second high permeability material is deposited proximate to a top surface of the second inductive element. The high permeability material may form a barrier to direct magnetic fields generated by the inductive element. In some embodiments, the high permeability material may be used as a shield to block magnetic fields generated by neighboring stacks or other components in the three-dimensional integrated circuit.

A magnetic coupling between the first inductive loop and the second inductive loop is formed using the first high permeability structure (308). The first high permeability structure can enhance the magnetic coupling between the first inductive loop and the second inductive loop. In some embodiments, the first high permeability structure and the second high permeability structure form a magnetic circuit coupling between the first inductive loop and the second inductive loop. In an embodiment, the high permeability structures control the magnetic fields generated by the inductive elements of each silicon substrate layer by guiding the magnetic fluxes between the layers. In one embodiment, the high permeability materials form a voltage reference plane for an inductive element to help contain electric and magnetic fields transmitted between the silicon substrate layers.

In an embodiment, the first silicon substrate includes trenches formed using the high permeability material. The first silicon substrate may include a series of trenches formed between different portions of the first inductive element. For example, the trenches may be formed adjacent to a portion of the inductive element such that the portion of the inductive element has a trench formed on each side of it. The trenches may contact a surface of the second silicon substrate layer or provide a gap (e.g., air gap, magnetic gap) between the high permeability material in the first silicon substrate and the high permeability material in the second silicon substrate to control the magnetic field strength in the high permeability materials and prevent saturation in the high permeability materials. In some embodiments, the second silicon substrate includes trenches formed using the high permeability material. In one embodiment, both the first and the second silicon substrate have trenches formed using the high permeability material.

In an embodiment, the method further includes coupling or depositing a heater resistor connected to either the first silicon substrate, the second silicon substrate, or both. The heater resistors can monitor and control a temperature in the three-dimensional integrated circuit, for example, to maintain the three-dimensional integrated circuit at or near a Curie temperature of the material forming the integrated circuit. In some embodiments, Neel temperature material is used in the first silicon substrate, the second silicon substrate, or both to maintain the three-dimensional integrated circuit at or near their respective Neel temperature. The antiferromagnetic material may have a higher Neel temperature to be able to handle various levels of heat generated by the different layers or structures of the three-dimensional integrated circuit.

In one example, a current supplied to the first inductive loop element may generate a magnetic field that is enhanced by the first layer of high permeability material. The magnetic field may inductively couple the second inductive loop element, where reception of the magnetic field is enhanced by the second layer of high permeability material. In one embodiment, one or more additional layers of high permeability material are deposited on the first and/or second silicon layers in order to shield the generated magnetic field and reduce crosstalk with other circuit components and inductive interconnects. The first and second layers may be two layers of a multilayer three-dimensional integrated circuit. In one embodiment, the three-dimensional circuit is an emitter-coupled logic (ECL) chip. In another embodiment, the three-dimensional circuit is a current mode logic (CML) chip.

Figure 4:
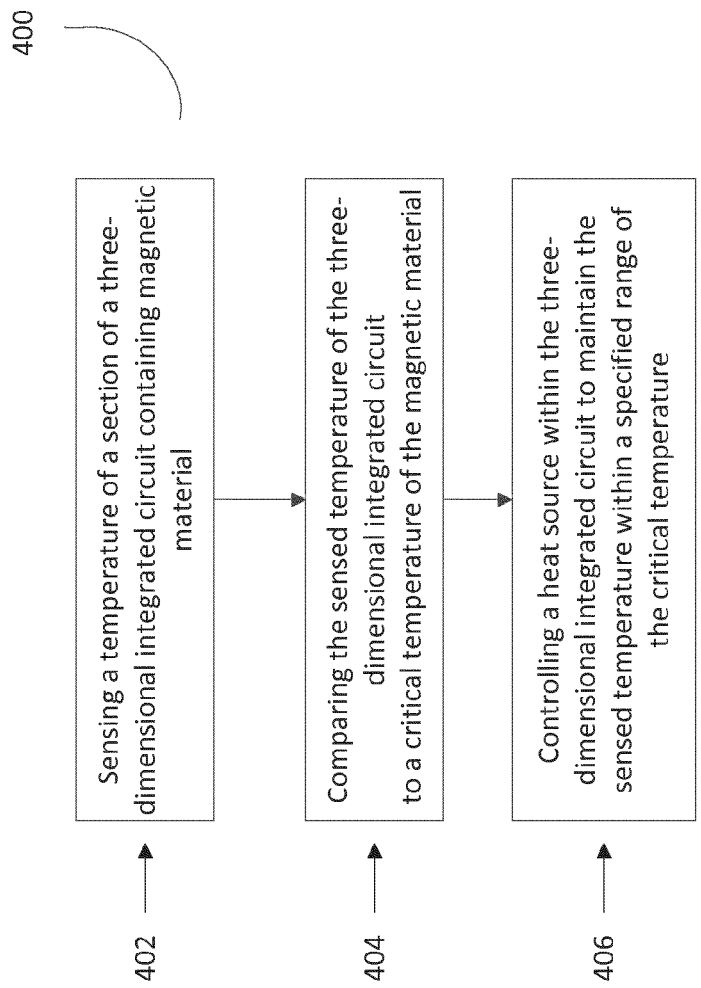
FIG. 4 is a flow diagram of a process of regulating a temperature of a three-dimensional integrated circuit, according to one embodiment.

Now referring to FIG. 4, a flow diagram of a process of regulating a temperature of a three-dimensional integrated circuit, according to one embodiment is shown. In brief overview, a temperature of a section of the three-dimensional integrated circuit containing magnetic material is sensed (402). The sensed temperature is compared to a critical temperature of the magnetic material (404). A heat source within the three-dimensional circuit can then be used to maintain the sensed temperature with a specified range of the critical temperature (406).

In some embodiments, the three-dimensional integrated circuit includes a temperature sensor to monitor the temperature of the three-dimensional integrated circuit. The temperature sensor can be a component of the three-dimensional integrated circuit or can be a separate device. The temperature sensor can measure a current temperature of a section of the three-dimensional integrated circuit. In some embodiments, the temperature sensor can measure a current temperature inside or around the three-dimensional integrated circuit. The temperature can be compared to a critical temperature of the magnetic material (e.g., threshold temperature).

In some embodiments, it is beneficial to maintain the temperature of the section of the three-dimensional integrated circuit within a specified range of the critical temperature of magnetic material within the three-dimensional integrated circuit. The critical temperature may refer to a temperature at which properties of the magnetic material are altered (e.g., Curie or Neel temperature). For example, the specified range may vary from about +/−1° of the critical temperature of the magnetic material. In one embodiment, the specified range is +/−0.1° of the critical temperature of the magnetic material.

In some embodiments, the heat source is controlled to maintain the temperature of the three-dimensional integrated circuit at or near a Curie or Neel temperature of materials making up the three-dimensional integrated circuit. The critical temperature may be based on the Curie or Neel temperature. For example, the critical temperature may be the Curie or Neel temperature of the materials making up the three-dimensional integrated circuit. In other embodiments, the critical temperature may be range of values near the Curie or Neel temperature. If the current temperature is greater than or less than the critical temperature or not within the specified range, the temperature of the three-dimensional integrated circuit can be modified.

In some embodiments, the temperature is modified to a temperature value within the specified range of the critical temperature. To modify the temperature, the three-dimensional integrated circuit may include a heat source, such as a heater resistor, to maintain and regulate the temperature of the three-dimensional integrated circuit. In other embodiments, the three-dimensional integrated circuit may include a heating element to modify the temperature of the three-dimensional integrated circuit. The heating element may include at least one of: an inductive element or circuitry of a neighboring element in the three-dimensional integrated circuit. For example, in one embodiment, a direct current (DC) can be supplied to an inductive element in the three-dimensional integrated circuit to cause the inductive element to produce more heat and increase the temperature. In some embodiments, the duty cycle or an operating point of neighboring circuitry can be altered to produce more heat and modify the temperature of the three-dimensional integrated circuit.

Figure 5:
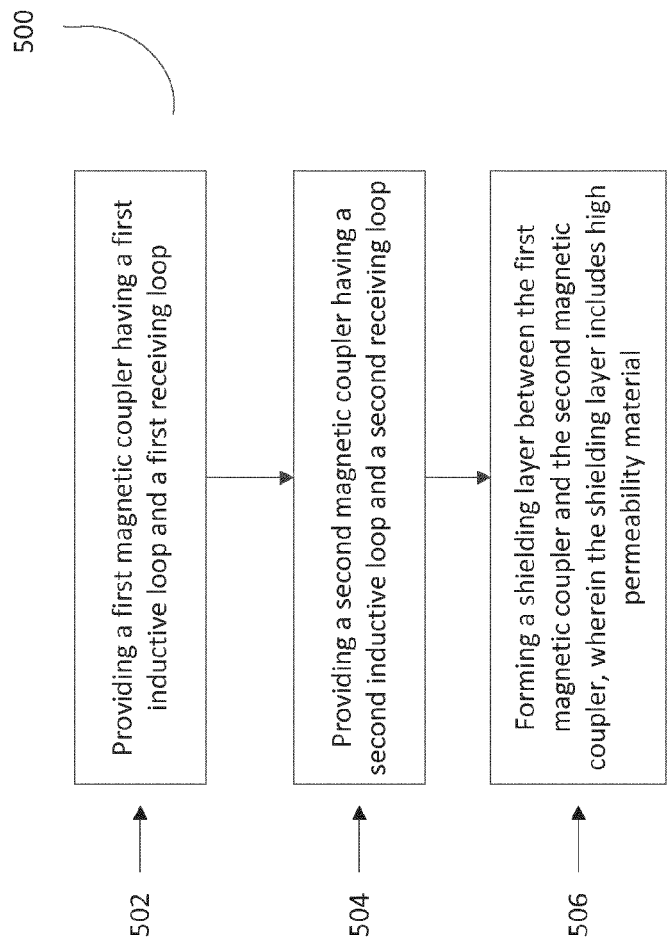
FIG. 5 is a flow diagram of a process of forming a shielding layer between a pair of magnetic couplers, according to one embodiment.

Now referring to FIG. 5, a flow diagram of a process of forming a shielding layer between a pair of magnetic couplers, according to one embodiment is shown. In brief overview, a first magnetic coupler having a first inductive loop and a first receiving element is provided (502). A second magnetic coupler having a second inductive loop and a second receiving element is provided (504). A shielding layer is formed between the first magnetic coupler and the second magnetic coupler. The shielding layer may include high permeability material (506).

The first inductive loop can be deposited on a first silicon substrate and the first inductive loop may provide a path for current of a circuit of the first silicon substrate. The first receiving can be deposited on a second silicon substrate. In some embodiments, the arrangement of the first inductive loop and the first receiving element is operable to form a closed loop magnetic field therebetween. In an embodiment, the second inductive loop can be deposited on a third silicon substrate and provide a path for current of a circuit of the second silicon substrate. The second receiving element can be deposited on a fourth silicon substrate. In some embodiments, the arrangement of the second inductive loop and the second receiving element is operable to form a closed loop magnetic field therebetween.

In an embodiment, the shielding layer is configured to block magnetic fields generated by the first magnetic coupler from radiating to the second magnetic coupler and is configured to block magnetic fields generated by the second magnetic coupler from radiating to the first magnetic coupler. In one embodiment, the shielding layer may form a complete shield around the first magnetic coupler and isolate the first magnetic coupler from the second magnetic coupler. The shielding layer may form a complete shield around the second magnetic coupler and isolate the second magnetic coupler from the first magnetic coupler.

The shielding layer of high permeability material may form a shield around a respective stack to contain electrical energy (e.g., magnetic field) in that stack so the energy does not radiate and/or interfere with a nearby stack. Similarly, the shielding layer may shield or protect a stack from external interference generated by a nearby stack. The shielding layer may be positioned between two adjacent stacks. However, the shielding layer may be formed on any surface of a stack. In this manner, inductive crosstalk between adjacent (or nearby) stacks and other circuit components may be reduced.

In some embodiments, a temperature of the first magnetic coupler, the second magnetic coupler, or both can be maintained near a Curie temperature or Neel temperature. The shielding layer can be used to maintain and regulate the temperature of the first magnetic coupler, the second magnetic coupler, or both. In some embodiments, the shielding layer includes high permeability material and the high permeability material includes a ferromagnetic material. The ferromagnetic material can be configured to operate near a Curie temperature or a Neel temperature of the ferromagnetic material to increase a permeability of the ferromagnetic material.

Figure 6:
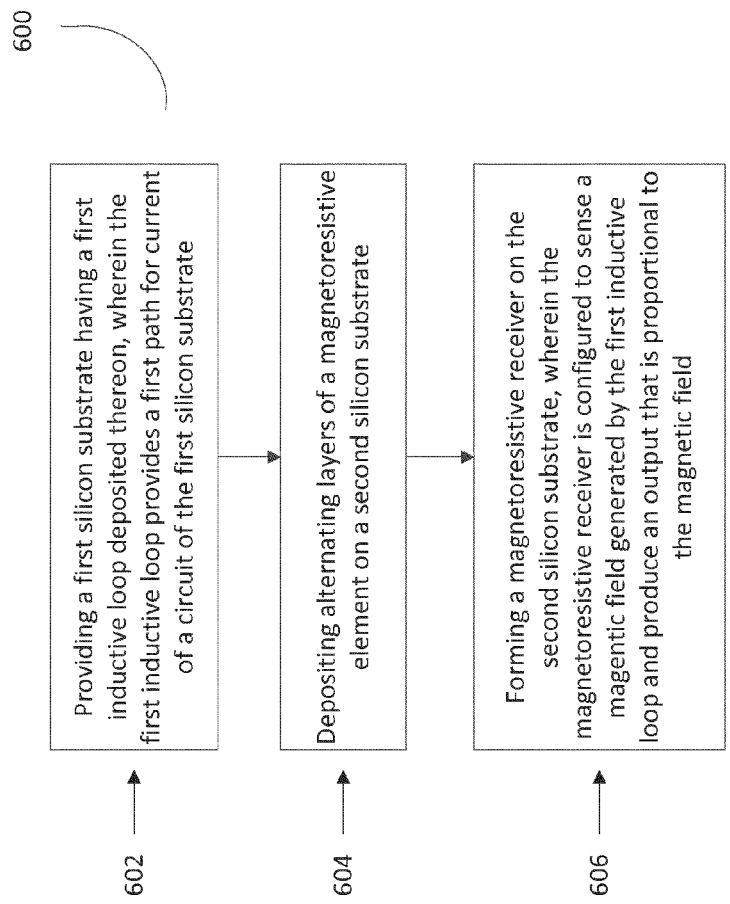
FIG. 6 is a flow diagram of a process of forming a three-dimensional integrated circuit with a magnetoresistive receiver, according to one embodiment.

Now referring to FIG. 6, a flow diagram of a process of forming a three-dimensional integrated circuit with a magnetoresistive receiver, according to one embodiment is shown. In brief overview, a first insulation layer having a first inductive loop deposited thereon is provided (602). Next, alternating layers of a magnetoresistive element are deposited on a first silicon substrate (604). A magnetoresistive receiver is formed on the first silicon substrate to sense a magnetic field generated by the first inductive loop and produce an output dependent on the magnetic field (606).

In some embodiments, the first inductive loop is formed on the insulation layer and the insulation layer is deposited onto the magnetoresistive receiver which includes the magnetoresistive element and the first silicon substrate. In other embodiments, the first inductive loop is formed on an insulation layer that is deposited on a second silicon substrate. The second silicon substrate is a different silicon substrate from the first silicon substrate. The second silicon substrate is then deposited on the magnetoresistive receiver which includes the magnetoresistive element and the first silicon substrate. The first inductive loop may generate a magnetic field that is sensed and received by the magnetoresistive receiver.

In some embodiments, the magneto resistive receiver includes the magnetoresistive element and the first silicon substrate. The magnetoresistive element can be a multi-layered structure that is formed by depositing alternating layers of ferromagnetic material and non-magnetic material on the silicon substrate. The ferromagnetic layers may be magnetic elements layers a few nanometers thick separated by equally thin non-magnetic elements layers. The magnetoresistive element can include at least two metallic films separated by a nonmagnetic layer. The magnetoresistive element can be configured to have anti-ferromagnetic coupling.

In an embodiment, the magnetoresistive receiver can be based on at least one of a giant magnetoresistance (GMR), a tunnel magnetoresistance (TMR), a colossal magnetoresistance (CMR), or a spin-coupled effect.

The construction and arrangement of the systems and methods as shown in the various embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the embodiments without departing from the scope of the present disclosure.

The present disclosure contemplates methods, systems and program products on any machine-readable media for accomplishing various operations. The embodiments of the present disclosure may be implemented or modeled using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. All such variations are within the scope of the disclosure. Likewise, software implementations could be accomplished with standard programming techniques with rule-based logic and other logic to accomplish the various connection steps, processing steps, comparison steps and decision steps.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A system for a non-contacting inductive interconnect of a three-dimensional integrated circuit, comprising:
    a first silicon substrate having a first inductive loop deposited thereon, wherein the first inductive loop provides a first path for current of a circuit of the first silicon substrate;
    a first layer of high permeability material deposited on the first silicon substrate forming a first high permeability structure;
    a second silicon substrate having a second inductive loop deposited thereon, wherein the second inductive loop provides a second path for current of a circuit of the second layer of silicon substrate, and wherein the first high permeability structure enhances a magnetic coupling between the first inductive loop and the second inductive loop; and
    a second layer of high permeability material deposited on the second silicon substrate forming a second high permeability structure;
    wherein at least one of the first layer of high permeability material and the second layer of high permeability material is configured to operate near a Neel temperature of the high permeability material;
    wherein the first silicon substrate includes at least one of a via or a trench, and wherein a portion of the first layer of high permeability material is deposited within the via or the trench.

2. The system of claim 1, wherein the arrangement of the first layer of high permeability material and the second layer of high permeability material is operable to form a closed loop magnetic field therebetween.

3. The system of claim 2, wherein the arrangement is such that the first layer of high permeability material is deposited on a top surface of the first silicon substrate and the second layer of high permeability material is deposited on a bottom surface of the second silicon substrate.

4. The system of claim 1, wherein the first high permeability structure and the second high permeability structure form a magnetic circuit coupling the first inductive loop and the second inductive loop.

5. The system of claim 1, further comprising a temperature sensor to monitor a temperature of the three-dimensional integrated circuit.

6. The system of claim 1, wherein the first silicon substrate includes a heater resistor to maintain a temperature of the three-dimensional integrated circuit.

7. The system of claim 1, further comprising a heating element to modify a temperature of the three-dimensional integrated circuit.

8. The system of claim 1, wherein the three-dimensional integrated circuit includes at least one of a current mode logic (CIVIL) type chip and an emitter-coupled logic (ECL) type chip.

9. A system for a non-contacting inductive interconnect of a three-dimensional integrated circuit, comprising:
    a first silicon substrate having a first inductive loop deposited thereon, wherein the first inductive loop provides a first path for current of a circuit of the first silicon substrate;
    a first layer of high permeability material deposited on the first silicon substrate forming a first high permeability structure;
    a second silicon substrate having a second inductive loop deposited thereon, wherein the second inductive loop provides a second path for current of a circuit of the second layer of silicon substrate, and wherein the first high permeability structure enhances a magnetic coupling between the first inductive loop and the second inductive loop; and
    at least one additional layer of high permeability material deposited over a portion of at least one of the first silicon substrate and the second silicon substrate, wherein the additional layer is configured to magnetically shield the first silicon substrate and the second silicon substrate from at least one adjacent component.

10. A system for a non-contacting inductive interconnect of a three-dimensional integrated circuit, comprising:
    a first magnetic coupler having a first inductive loop and a first receiving element;
    a second magnetic coupler having a second inductive loop and a second receiving element; and
    a shielding layer disposed between the first magnetic coupler and the second magnetic coupler, wherein the shielding layer comprises high permeability material;
    wherein the shielding layer is configured to block magnetic fields generated by the first magnetic coupler from radiating to the second magnetic coupler.

11. The system of claim 10, wherein the high permeability material includes a ferromagnetic material.

12. The system of claim 11, wherein the ferromagnetic material is configured to operate near a Curie temperature of the ferromagnetic material to increase a permeability of the ferromagnetic material.

13. The system of claim 10, wherein the first inductive loop is deposited on a first silicon substrate, wherein the first inductive loop provides a path for current of a circuit of the first silicon substrate.

14. The system of claim 10, wherein the first receiving element is deposited on a second silicon substrate.

15. The system of claim 10, wherein the three-dimensional integrated circuit includes at least one of a current mode logic (CML) type chip and an emitter-coupled logic (ECL) type chip.

16. The system of claim 10, wherein the shielding layer is configured to block magnetic fields generated by the second magnetic coupler from radiating to the first magnetic coupler.

17. A system for a non-contacting inductive interconnect of a three-dimensional integrated circuit, comprising:
    a first magnetic coupler having a first inductive loop and a first receiving element;
    a second magnetic coupler having a second inductive loop and a second receiving element; and
    a shielding layer disposed between the first magnetic coupler and the second magnetic coupler, wherein the shielding layer comprises high permeability material;
    wherein the arrangement of the first inductive loop and the first receiving element is operable to form a closed loop magnetic field therebetween.

18. A system for a non-contacting inductive interconnect of a three-dimensional integrated circuit, comprising:

a first magnetic coupler having a first inductive loop and a first receiving element;

a second magnetic coupler having a second inductive loop and a second receiving element; and a shielding layer disposed between the first magnetic coupler and the second magnetic coupler, wherein the shielding layer comprises high permeability material;

wherein the shielding layer is configured to maintain a temperature near a Curie temperature or Neel temperature of the first magnetic coupler.

19. A system for a non-contacting inductive interconnect of a three-dimensional integrated circuit, comprising:

a first magnetic coupler having a first inductive loop and a first receiving element;

a second magnetic coupler having a second inductive loop and a second receiving element; and a shielding layer disposed between the first magnetic coupler and the second magnetic coupler, wherein the shielding layer comprises high permeability material;

wherein the high permeability material includes a ferromagnetic material; and wherein the ferromagnetic material includes high permeability nanoparticles.

20. The system of claim 19, wherein the high permeability nanoparticles includes a plurality of particle types, wherein at least two particle types have opposing permeability-to-temperature dependencies over a temperature range of interest.

21. A system for a magnetic coupled interconnect of a three-dimensional integrated circuit, comprising:

a first silicon substrate having a first inductive loop deposited thereon, wherein the first inductive loop provides a first path for current of a circuit of the first silicon substrate; and a magnetoresistive receiver formed on a second silicon substrate, wherein the magnetoresistive receiver is configured to sense a magnetic field generated by the first inductive loop and produce an output that is dependent on the magnetic field.

22. The system of claim 21, wherein the magnetoresistive receiver is a multi-layered structure including a magnetoresistive element and the second silicon substrate.

23. The system of claim 22, wherein the magnetoresistive element is a multi-layered structure including alternating layers of ferromagnetic material and non-magnetic material.

24. The system of claim 23, wherein the magnetoresistive element includes at least two metallic films separated by a nonmagnetic layer.

25. The system of claim 23, wherein the magnetoresistive element is configured to have anti-ferromagnetic coupling.

26. The system of claim 21, wherein the magnetoresistive receiver is configured to produce a voltage output dependent on the magnetic field.

27. The system of claim 21, wherein a magnetoresistive element of the magnetoresistive receiver employs a giant magnetoresistance (GMR).

28. The system of claim 21, wherein a magnetoresistive element of the magnetoresistive receiver employs a tunnel magnetoresistance (TMR).

29. The system of claim 21, wherein a magnetoresistive element of the magnetoresistive receiver employs a colossal magnetoresistance (CMR).

30. The system of claim 21, wherein a magnetoresistive element of the magnetoresistive receiver employs a spin-coupled effect.

31. A system for a non-contacting inductive interconnect of a three-dimensional integrated circuit, comprising:

a first silicon substrate having a first inductive loop deposited thereon, wherein the first inductive loop provides a first path for current of a circuit of the first silicon substrate;

a first layer of high permeability material deposited on the first silicon substrate forming a first high permeability structure;

a second silicon substrate having a second inductive loop deposited thereon, wherein the second inductive loop provides a second path for current of a circuit of the second layer of silicon substrate, and wherein the first high permeability structure enhances a magnetic coupling between the first inductive loop and the second inductive loop; and at least one of:

a temperature sensor configured to monitor a temperature of the three-dimensional integrated circuit;

a heater resistor configured to maintain a temperature of the three-dimensional integrated circuit; and a heating element configured to modify a temperature of the three-dimensional integrated circuit.

* * * * *